ELECTRONICALLY VARIABLE RADIO FREQUENCY ATTENUATOR

Filed June 23, 1965

INVENTORS,
EDWARD HIRSHFIELD
EDWARD MIZUNO &
ROBERT L. TROUARD.

BY Harry M. Saragovitz, Edward J. Kelly, Herbert Berl & Julian C. Keppler
ATTORNEYS United States Patent Office 3,431,506

Patented Mar. 4, 1969

3,431,506

ELECTRONICALLY VARIABLE RADIO FREQUENCY ATTENUATOR

Edward Hirshfield, San Jose, Edward Mizuno, Oakland, and Robert L. Trouard, Santa Clara, Calif., assignors, by mesne assignments, to the United States of America as represented by the Secretary of the Army Filed June 23, 1965, Ser. No. 466,488

U.S. Cl. 330—22 17 Claims

Int. Cl. H03f *3/04;* H03g *3/30*

ABSTRACT OF THE DISCLOSURE

An RF attenuator which includes a first transistor having the collector and emitter electrodes connected to the signal path. The control transistor has an input terminal connected thereto for connection to an RF signal level detector such as a typical automatic gain control circuit. Voltages applied to this input channel from the RF level detector varies the bias on the first transistor such that the impedance presented to the RF signal path by the first transistor will vary inversely with the level of the input RF signal.

The present invention relates to a means for increasing the total dynamic range of radio receivers and more particularly to an electronically variable radio frequency attenuator.

Those concerned with the development of small battery powered radio receivers have long recognized the need for the improvement of the RF attenuators which are commonly used as means for increasing the total dynamic range of the receivers. RF attenuators in the past have been characterized by at least one or more of the following disadvantages: low attenuation, high insertion loss, high power requirements, high current drain, and distortion and inefficiencies introduced by large supply voltage variations.

The general purpose of this invention is to provide an attenuator which is free of all of the above-noted disadvantages. To attain this, the present invention contemplates a unique arrangement of transistors which act as an electronically variable impedance under the control of the automatic gain control circuitry of the receiver. The particular transistor which acts as the variable impedance has no direct current flowing in its collector circuit, while the remaining transistors which function as the control circuitry for the first-mentioned transistor can operate on low current from an unregulated power supply.

It is, therefore, the object of the present invention to provide an RF attenuator as a means for increasing the dynamic range of a receiver.

Another object is to provide an RF attenuator having a relatively high attenuation.

A further object of the invention is the provision of an RF attenuator which will introduce a relatively low insertion loss.

Still another object of the invention is to provide an RF attenuator having relatively low power requirements.

Yet another object of the present invention is the provision of an attenuator the control circuit of which uses very low current.

A still further object of the invention is the provision of an RF attenuator adaptable to cascade application for additional attenuation with no increase in current drain.

A still further object of the invention is the provision of an RF attenuator which is operable with large supply voltage variations.

Other objects and many of the attendant advantages of this invention will be readily appreciated as the same becomes better understood by reference to the following detailed description when considered in connection with the accompanying drawings in which like reference numerals designate like parts throughout the figures thereof, and wherein.

Figure 1:
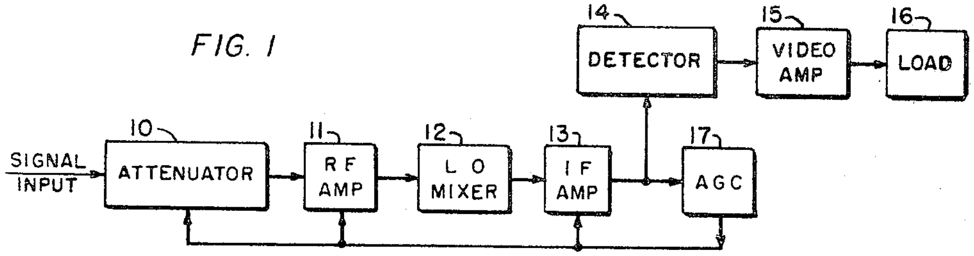
FIG. 1 is a block diagram of a receiver showing the relationship between the attenuator and other elements thereof.

Referring now to the drawings, wherein like reference characters designate like or corresponding parts throughout the several views, there is shown in FIG. 1 a receiver having an RF input signal applied to the attenuator 10 which forms the first stage thereof. The RF output signal from attenuator 10 is then applied to the usual RF amplifier 11, the local oscillator-mixer 12 where the signal is changed to the IF, the usual IF amplifier 13, the detector 14 where the IF is detected, the video amplifier 15, and the load or utilization device 16. A portion of the IF signal is extracted from the amplifier 13 by the automatic gain control circuit 17 where the signal level is detected. The detected signal is DC amplified in AGC 17 and an output signal is developed which is a function of the RF signal level. This output signal from AGC 17 will also vary with the variations in the power supply voltage of the receiver as a result of the DC amplification. This output from AGC 17 is then fed back to the amplifiers 13 and 11 to reduce the gains thereof with increases in the strength of the input signal. The range over which the gain of amplifiers 11 and 13 may be varied by the AGC 17 will determine the dynamic range of amplifiers 11 and 13. The dynamic range of the entire system is made substantially larger than the dynamic range of the amplifiers 11 and 13 alone as a result of the attenuator 10 which is also controlled by the signal from AGC 17. In the present invention, attenuation of the input signal is accomplished in attenuator 10 by a transistor element the impedance of which is varied by a control circuit which in turn is controlled by the signal from the AGC 17. The threshold of attenuator 10 may be set to automatically turn on when the signal from the AGC 17 has reduced the gain of amplifiers 11 and 13 to a minimum.

It is desirable that the attenuator 10 should have a relatively low insertion loss (i.e., low attenuation of the input signal when the attenuator 10 is turned off), high attenuation when turned on, relatively low power consumption, low current drain, and little distortion. These qualities are of utmost importance when the receiver is a transistorized circuit which operates from relatively small batteries.

Figure 2:
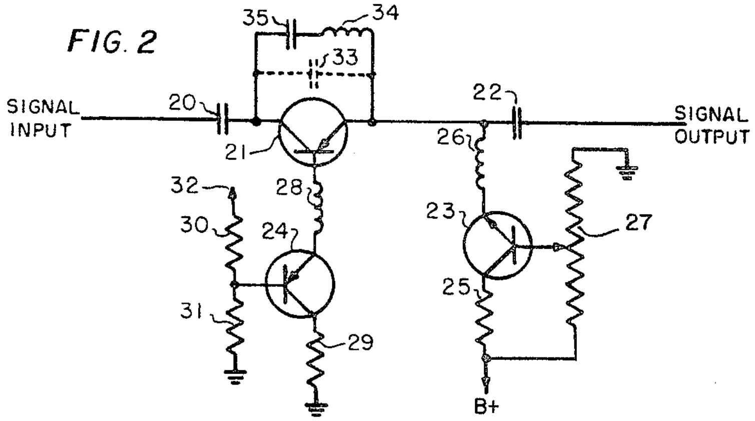
FIG. 2 shows a circuit diagram of the basic embodiment of the preferred form of the invention.

FIG. 2 shows the preferred form of the present invention. A coupling capacitor 20 connects an input device (not shown) such as an antenna to the floating collector of the attenuating PNP transistor 21. The emitter of transistor 21 is coupled by a capacitor 22 to the next stage of the receiver which in this example is the RF amplifier 11 (FIG. 1). The impedance which the collector-to-emitter circuit of transistor 21 presents to a signal applied to capacitor 20 will be determined by the relative voltage difference between the base and emitter leads of transistor 21. This voltage difference is controlled by the threshold NPN transistor 23 and the control PNP transistor 24. It is to be understood that other types of transistors may be used by merely changing the biases.

The collector of transistor 23 is connected to the B+ supply voltage through a resistor 25, the emitter is connected to the emitter of transistor 21 through a choke coil 26, and the base lead is connected to the movable arm of a variable voltage divider 27. The resistor or voltage divider 27 is connected between ground and the B+ supply voltage.

The transistor 24 has its emitter lead connected to the base of transistor 21 through choke coil 28 and its collector lead connected to ground through resistor 29. The base lead of transistor 24 is connected to a voltage divider at a point between resistors 30 and 31 which in turn are connected in series between ground and an input terminal 32. The signal from AGC 17 (FIG. 1) is applied to terminal 32.

Capacitor 33, connected from the collector to the emitter of transistor 21, represents the internal collector-to-emitter capacitance of transistor 21. This internal capacitance 33 is neutralized by resonating it with the inductance of shunt inductor 34 at the frequency of interest. Capacitor 35 is inserted to provide DC blocking through inductor 34.

The operation of the attenuator will now be described. An RF signal path is provided from the input through capacitor 20, the collector and emitter leads of transistor 21, and capacitor 22, the collector and emitter leads of transistor 21, and capacitor 22 to the output. The attenuation of this RF signal will depend on the impedance from collector to emitter of transistor 21 which in turn can be varied by varying the voltage difference between its emitter and base. A DC path is provided from B+ through resistors 27 and 25, transistor 23, coil 26, the emitter and base of transistor 21, coil 28, transistor 24, resistors 31 and 29, and ground, when no signal is applied to terminal 32. The magnitude of the DC through transistor 21 will depend on the value of the bias resistors. Resistors 30, 31, and 29 provide the bias to transistor 24 and the bias on transistor 23 is determined by variable voltage divider 27 and resistor 25. The variable voltage divider 27 is adjusted to obtain the desired bias on transistor 23 for proper forward bias of the emitter base junction of transistor 21 when no signal is applied to terminal 32. The point at which the attenuator will be turned on will therefore be determined by the setting of the divider 27. With the attenuator turned off, i.e., no signal applied to terminal 32, the DC current flow from the emitter to the base of transistor 21 will cause minority carriers to be piled up in the base region and the signal applied to the collector will be coupled through to the emitter because of these carriers. When the attenuator is turned on (high attenuation), by applying a signal to terminal 32 and thereby raising the voltage at the emitter of transistor 24, the emitter-to-base voltage of transistor 21 will be reduced and may even be reversed causing the number of minority carriers in the base region of transistor 21 to be greatly depleted. This results in having no signal path or a large impedance from the collector to the emitter of the transistor 21. In the limiting case, the capacitance 33 from emitter to collector will provide a low impedance in the signal path. However, the inductor 34 has been added to resonate with the capacitance 33 to present a high impedance at the operating frequency. Only a small voltage difference with little current is required from the emitter to the base of the transistor 21 to establish little or no attenuation of the RF signal. As the voltage at terminal 32 is increased, thereby reducing this voltage difference or even reversing the relative polarity of the voltage from emitter to base of transistor 21, the DC current through transistor 21 will be decreased, the collector-to-emitter impedance will be increased, and the RF signal will be attenuated.

Using standard germanium transistors it was found in one case that the voltage at the emitter of transistor 24 (or voltage at base of transistor 21) need only be 0.4 volt more negative than the voltage of the emitter of transistor 21, and the DC current through transistor 21 need only be 0.7 milliamp, for a relatively low impedance from input to output. When turning the device on varying degrees of attenuation were obtained with the emitter voltage of transistor 24 between −0.4 volt and +0.2 volt relative to the voltage at the emitter of transistor 21. In addition to the fact that current through the attenuating transistor 21 is low, the control circuit adds little additional current drain since the circuits are in series. The control circuit has the additional advantage in that the threshold voltage (voltage at emitter of transistor 23) varies with the B+ supply voltage variations in the same way that the DC amplified AGC voltage applied to terminal 32 does. Therefore, large variations in the B+ supply voltage will not effect the voltage difference from emitter to base of transistor 21. The voltage developed at the emitter of transistor 23 is primarily dependent on the setting of the voltage divider 27 and establishes a "threshold voltage" which determines the point at which the attenuator is turned on. The voltage developed at the emitter of transistor 24 is the "control voltage" which depends on the signal applied to terminal 32. Therefore, the "control voltage" must reach a certain level which is established by the "threshold voltage" to turn the attenuator on. The voltage difference between the "threshold voltage" and the "control voltage" will be substantially independent of variations in the B+ voltage since the AGC signal applied to terminal 32 will also vary with the variations in the B+ voltage.

Figure 3:
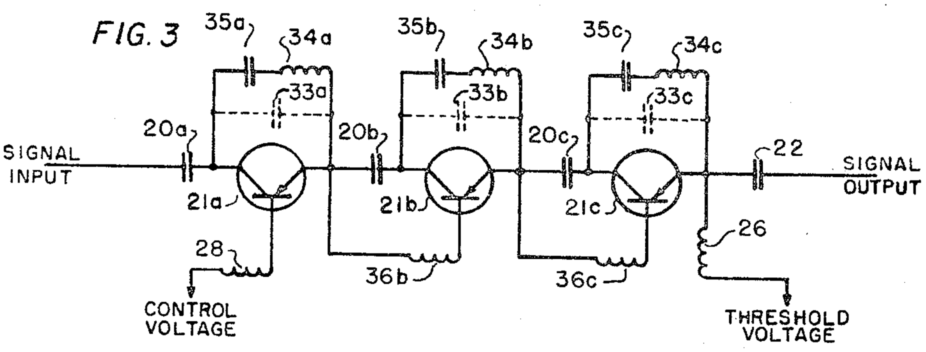
FIG. 3 shows a circuit diagram of another form of the invention.

FIG. 3 shows three attenuators connected in series. The control and threshold circuits are not shown. The terminal marked control voltage would have connected to it the emitter of transistor 24 of FIG. 2 and the terminal marked threshold voltage would have connected to it the emitter of transistor 23. Between the control voltage terminal and the threshold voltage terminal there are three attenuating transistors **21*a*, 21*b*, and 21*c*. An RF signal path is provided from the input through the collector and emitter leads of the transistors 21*a*, 21*b*, and 21*c*; coupling capacitors 20*a*, 21*b*, and 21*c*; and output coupling capacitor 22. A DC path is provided from the threshold voltage terminal through choke coil 26, the emitter-base junction of transistor 21*c*, choke coil 36*c*, the emitter-base junction of transistor 21*b*, choke coil 36*b*, the emitter-base junction of transistor 21*a*, choke coil 28 and the control voltage terminal. Attenuation of the RF input signal will occur when the transistors 21*a*, 21*b*, and 21*c*** are back biased by raising the control voltage relative to the threshold voltage in the same manner as explained above in connection with FIG. 2.

Attenuation will be enhanced in the device of FIG. 3 because of the additional attenuating transistors **21*a*, 21*b*, and 21*c*. This enhanced attenuation is accomplished with little or no additional current drain because of the series connection. The device of FIG. 3 has the additional advantage of being able to provide attenuation over a broader band of frequencies by resonating the capacitors 33*a*, 33*b*, and 33*c* with the inductors 34*a*, 34*b*, and 34*c*, respectively, at different but contiguous frequency bands. The capacitors 35*a*, 35*b*, and 35*c*** are provided for DC blocking.

Figure 4:
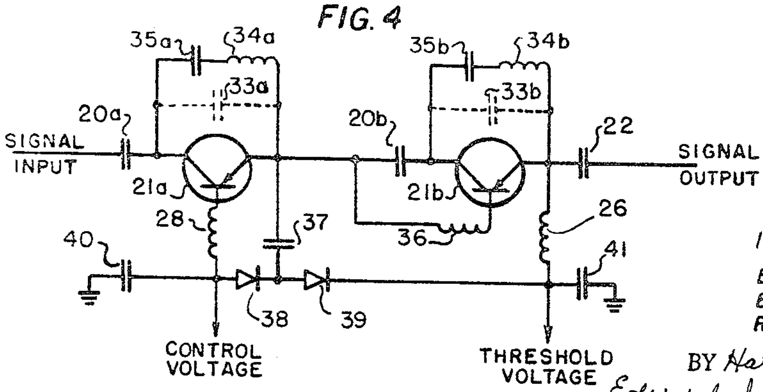
FIG. 4 shows a circuit diagram of still another form of the invention.

The device of FIG. 4 provides even greater attenuation by providing low impedance paths to ground when the attenuator is turned on. Two series connected attenuating transistors **21*a*, and 21*b* are connected in cascade in the signal path with coupling capacitors 20*a*, 20*b*, and 22. A pair of diodes 38 and 39 are connected between the control voltage terminal and the threshold voltage terminal which will determine the bias thereon. A DC blocking capacitor 37 connects the signal path at the emitter of transistor 21*a* to the cathode and anode of diodes 38 and 39, respectively. A capacitor 40 connects the anode of diode 38 to ground and a capacitor 41 connects the cathode of diode 39 to ground. When the attenuator is turned off, i.e., the control voltage will be some predetermined value more negative than the threshold voltage, the emitter-base junctions of transistors 21*a* and 21*b* will be forward biased and the input signal will be coupled to the output with no attenuation. The diodes 38 and 39 will be back biased with the control voltage negative with respect to the threshold voltage and will present a high impedance to the RF signal. As the control voltage rises with respect to the threshold voltage transistors 21***a* and 21*b* will present a high impedance to the RF signal while diodes 38 and 39, which will now be forward biased, will present a low impedance to the RF signal. Therefore, while transistors 21*a* and 21*b* attenuate the RF signal by providing a high impedance path, diodes 38 and 39 will be providing even further attenuation by providing a low impedance path to ground to the RF signal. It is understood, of course, that the diodes 38 and 39, and capacitors 37, 40, and 41 may also be used with the device of FIG. 2 by merely connecting the elements as indicated in FIG. 4.

What is claimed is:

1. An RF attenuator comprising; a transistor having collector, emitter, and base electrodes; means for providing an RF signal path through said collector and emitter electrodes; a source of DC potential; threshold means connected between one side of said source and said emitter electrode for maintaining a predetermined voltage at said emitter electrode; control means connected between the other side of said source and said base electrode for establishing a forward bias between said emitter and base electrodes; and means coupled to said control means for reducing said forward bias with predetermined increases in the strength of said RF signal.

2. The attenuator according to claim 1 and further including means connected between said emitter and collector electrodes for resonating with the internal collector to emitter capacitance of said transistor at the frequency of said RF signal.

3. An RF attenuator comprising; a transistor having collector, emitter, and base electrodes; means for providing an RF signal path through said collector and emitter electrodes; a source of potential; threshold means connected between said source of potential and said emitter electrode for establishing a predetermined voltage at said emitter electrode; a control voltage input terminal; means connected in said signal path for detecting the strength of said RF signal and applying a corresponding control voltage to said terminal; and control means connected between said terminal and said base electrode for selectively increasing and decreasing the voltage of said base electrode with respect to said predetermined voltage upon corresponding increases and decreases in said control voltage at said terminal.

4. The attenuator according to claim 3 and further including means connected between said emitter and collector electrodes for resonating with the internal collector to emitter capacitance of said transistor at the frequency of said RF signal.

5. An RF attenuator comprising; a first transistor having emitter, base, and collector electrodes; an RF signal input terminal coupled to said collector by a capacitor; an RF signal output terminal coupled to said emitter by a capacitor; a second transistor having the emitter thereof coupled to the emitter of said first transistor through an inductor; a source of potential connected to the collector of said second transistor through a resistor; a variable voltage divider connected between said source of potential and ground; the base electrode of said second transistor connected to the movable arm of said variable voltage divider; a third trasistor having the emitter electrode thereof coupled to the base electrode of said first transistor through an inductor, the collector electrode thereof coupled to said ground, and the base electrode thereof coupled to a control voltage input terminal; said source of potential being of a polarity to normally forward bias the emitter-base electrodes of said first transistor: and said control voltage when applied being of a polarity to reduce said forward bias.

6. The attenuator according to claim 5 and further including a series connected capacitor and inductor connected across the emitter and collector electrodes of said first transistor and wherein said capacitor and inductor in combination with the internal emitter to collector capacitance of said first transistor resonates at the frequency of said RF signal.

7. The attenuator according to claim 6 and wherein the emitter of said second transistor is coupled to the emitter of said third tansistor through first and second diodes having the anode of one connected to the cathode of the other and connected through a capacitor to the emitter of said first transistor; and the emitters of said second and third transistor each being coupled to ground through a capacitor.

8. An RF attenuator comprising; a plurality of transistors each having input collector; output emitter, and base terminals; capacitive means connecting said transistors in cascade for providing an RF signal path through said collector and emitter terminals; a source of potential; means connected between one side of said source and the emitter terminal of the last transistor in said cascade for maintaining a predetermined voltage at the emitter terminal of said last transistor; each adjacent pair of transistors in said cascade having the emitter terminal of one connected to the base terminal of the succeeding transistor by inductive means for providing a direct current path through said emitter base terminals; control means connected between the other side of said source and the base terminal of the first transistor in said cascade for establishing a forward bias between the emitter base terminals of said transistors; and means connected to said control means for reducing said forward bias with predetermined increases in the strength of said RF signal.

9. The attenuator of claim 8 wherein each said transistor has connected between said emitter and collector terminals thereof a means for resonating with the internal collector to emitter capacitance of its associated transistor; and wherein said last-mentioned means each resonate at different and contiguous frequency bands.

10. The attenuator according to claim 9 and further including switching means connected across said RF signal path and controlled by said predetermined voltage and said control means for selectively providing a low impedance path to said RF signal with said predetermined increases in the strength of said RF signal.

11. An RF attenuator comprising; a plurality of transistors each having input collector, output emitter, and base terminals; capacitive means connecting said transistors in cascade for providing an RF signal path through said collector and emitter terminals; a source of potential; means connected between said source and the emitter of the last transistor of said cascade for maintaining a predetermined voltage at the emitter of said last transistor; a control voltage input terminal; means connected in said signal path for detecting the strength of said RF signal and applying a corresponding control voltage to said control voltage input terminal; control means connected between said control voltage terminal and the base terminal of the first transistor in said cascade for selectively increasing and decreasing the voltage of said base terminal of said first transistor with respect to said predetermined voltage upon corresponding increases and decreases in said control voltage; and each adjacent pair of transistors in said cascade having the emitter terminal of one connected to the base terminal of the succeeding transistor by inductive means for providing a direct current path through said emitter base terminals.

12. The attenuator according to claim 11 and further including switching means connected across said RF signal path and controlled by said control means and said predetermined voltage for selectively providing a low impedance RF signal path with said corresponding increases in said control voltage.

13. The attenuator according to claim 12 and wherein each said transistor has connected between said emitter and collector terminals thereof a means for resonating with the internal collector to emitter capacitance of its associated transistor; and wherein said last-mentioned means each resonate at different and contiguous frequency bands.

14. An RF attenuator comprising; a plurality of transistors each having input collector, output emitter, and base terminals; capacitive means connecting said transistors in cascade for providing an RF signal path through said collector and emitter terminals; each adjacent pair of transistors in said cascade having the emitter terminal of one connected to the base terminal of the succeeding transistor by inductive means for providing a direct current path through said emitter base terminals; a source of direct current potential; means connected across said source of potential and on one side to the base terminal of the first transistor in said cascade and on the other side to the emitter terminal of the last transistor in said cascade for providing a predetermined direct current through said direct current path; and means connected in said RF signal path for detecting the strength of said RF signal and connected to said last-mentioned means for reducing said direct current with predetermined increases in the strength of said RF signal.

15. An RF attenuator comprising; a plurality of attenuating transistors each having input collector, output emitter, and base terminals; capacitive means connecting said transistors in cascade for providing an RF signal path through said collector and emitter terminals; an RF signal input terminal coupled to the collector of the first transistor in said cascade by a capacitor; an RF signal output terminal capacitively coupled to the emitter of the last transistor in said cascade; and each adjacent pair of transistors in said cascade having the emitter terminal of one connected to the base terminal of the succeeding transistor by an inductor; a threshold transistor having the emitter thereof coupled to the emitter of said last transistor through an inductor; a source of potential connected to the collector of said threshold transistor through a resistor; a variable voltage divider connected between said source of potential and ground; the base electrode of said threshold transistor connected to the movable arm of said variable voltage divider; a control transistor having the emitter electrode thereof coupled to the base electrode of said first transistor in said cascade through an inductor, the collector electrode thereof coupled to said ground, and the base electrode thereof coupled to a control voltage input terminal; said source of potential being of a polarity to normally forward bias the emitter-base electrodes of said attenuating transistors; and said control voltage when applied being of a polarity to reduce said forward bias.

16. The attenuator according to claim 15 wherein each said attenuating transistor has connected across said emitter and collector terminals thereof a DC blocking capacitor and an inductor connected in series with said blocking capacitor to form a resonant circuit with the internal emitter to collector capacitance of its associated transistor; and wherein said resonant circuits each resonate at different and contiguous frequency bands.

17. The attenuator according to claim 16 and wherein the emitter of said first transistor is coupled to the emitter of said second transistor through a plurality of diodes being connected in tandem with the anode of one connected directly to the cathode of the next and through a capacitor connected to the emitter of an attenuating transistor; and the emitters of said first and second transistors each being coupled to ground through a capacitor.

References Cited

UNITED STATES PATENTS

| | | | |
|---|---|---|---|
| 2,973,439 | 2/1961 | Wright | 307—237 |
| 3,240,956 | 3/1966 | Stone et al. | 307—237 |
| 2,973,439 | 2/1961 | Wright | 307—237 |
| 3,240,956 | 3/1966 | Stone et al. | 307—237 |

FOREIGN PATENTS

| | | |
|---|---|---|
| 514,004 | 10/1939 | Great Britain. |
| 514,004 | 10/1939 | Great Britain. |

NATHAN KAUFMAN, *Primary Examiner.*

U.S. Cl. X.R.

330—26, 29